United States Patent [19]
Enström et al.

[11] Patent Number: 6,052,036
[45] Date of Patent: Apr. 18, 2000

[54] CRYSTAL OSCILLATOR WITH AGC AND ON-CHIP TUNING

[75] Inventors: Håkan Enström, Lund; Erik Bengtsson, Helsingborg; Torbjörn Gardenfors, Malmo, all of Sweden

[73] Assignee: Telefonaktiebolaget L M Ericsson

[21] Appl. No.: 08/962,480

[22] Filed: Oct. 31, 1997

[51] Int. Cl.$^7$ ................................. H03B 5/30; H03L 1/00
[52] U.S. Cl. ................. 331/176; 331/66; 331/116 R; 331/74; 331/183; 331/177 V; 331/158; 331/109
[58] Field of Search .................... 331/182, 183, 331/177 V, 158, 186, 74, 176, 66, 116 R, 109

[56] References Cited

U.S. PATENT DOCUMENTS

| | | | |
|---|---|---|---|
| 3,815,048 | 6/1974 | Hamlet | 331/109 |
| 3,979,693 | 9/1976 | Saari | 331/61 |
| 4,028,638 | 6/1977 | Towle | 331/109 |
| 4,272,840 | 6/1981 | Morozumi et al. | 368/202 |
| 4,453,834 | 6/1984 | Suzuki et al. | 368/201 |
| 4,473,303 | 9/1984 | Suzuki | 368/201 |
| 4,518,933 | 5/1985 | Kroner | 331/108 D |
| 4,978,930 | 12/1990 | Suter | 331/176 |
| 5,150,081 | 9/1992 | Goldberg | 331/109 |
| 5,528,201 | 6/1996 | Davis | 331/116 FE |
| 5,548,252 | 8/1996 | Watanabe et al. | |
| 5,608,359 | 3/1997 | Knecht et al. | 331/68 |
| 5,801,594 | 9/1998 | Muto et al. | 331/158 |
| 5,801,596 | 9/1998 | Sakurai | 331/176 |

FOREIGN PATENT DOCUMENTS

| | | |
|---|---|---|
| 0 658 004 A2 | 6/1995 | European Pat. Off. |
| 0 709 965 A1 | 5/1996 | European Pat. Off. |
| WO96/17433 | 6/1996 | WIPO |
| WO96/03799 | 8/1996 | WIPO |
| WO96/32775 | 10/1996 | WIPO |

*Primary Examiner*—Arnold Kinkead
*Attorney, Agent, or Firm*—Jenkens & Gilchrist, P.C.

[57] ABSTRACT

A highly stable single chip crystal controlled oscillator with automatic gain control. An amplitude detector monitors the output of a crystal controlled oscillator amplifier and produces a feedback signal proportional to the output signal of the amplifier to ensure oscillation is induced at startup and that the amplitude of oscillation is limited to a preselected value during operation to conserve power consumption by the amplifier. The capacitor tank circuit connected to the input of the amplifier includes a voltage variable capacitor the voltage across which is initially established at manufacture to tune the oscillation frequency to a preselected value. The voltage across the voltage variable capacitor is also adjusted to compensate for temperature variations in the circuit.

22 Claims, 2 Drawing Sheets

CRYSTAL OSCILLATOR WITH AGC AND ON-CHIP TUNING

BACKGROUND OF THE INVENTION

1. Field of the Invention

The invention relates to crystal oscillators and, more particularly, to a highly stable, single-chip voltage control crystal oscillator with automatic gain control.

2. Description of the Related Art

Radio frequency communication technologies have made dramatic advances in the past several years. For example, the applications for wireless communications technology have increased many fold and the subscribers who use such wireless communications have grown dramatically in number. The increased utilization of digital modulation techniques, such as time division multiple access (TDMA) and code division multiple access (CDMA) along with the substantial growth in traffic density over systems implementing these modulation techniques requires both closer carrier frequency spacing and decreased modulation bandwidth. The frequency stability of reference oscillators has become increasingly important in this environment.

While crystal-controlled oscillators have been used for decades in electronic systems as frequency references, such oscillators vary widely in their different characteristics such as output waveform, frequency stability and amplitude stability under various loads, temperature and power supply conditions. Many such oscillators have been implemented using bi-polar transistors as active elements. However, the dominant technology for the fabrication of most integrated circuits today is CMOS and design techniques for highly stable crystal oscillators in this technology are less well known.

As mentioned above, high performance wireless telecommunication applications require very accurate frequency reference sources. The accuracy and frequency stability of an oscillator is, in general, affected by various factors such as production, temperature and aging variations, that require oscillator frequency variations to be compensated. Most prior art oscillator circuit configurations which include compensation circuitry have included those compensation circuits as external to the integrated circuit containing the oscillator itself. This is more costly from a manufacturing standpoint as well as less compact from a miniaturization perspective, a very important factor in contemporary design of wireless devices.

Two important elements in the design of highly stable crystal oscillator circuits are the control of power consumption by the oscillator itself and frequency compensation of the oscillator for both production variations and for temperature variations during operation. Prior art techniques such as those shown in U.S. Pat. No. 5,548,252 to Watanabi et al. have attempted to address these issues. This patent discloses a digital temperature compensated crystal oscillator which includes certain features relevant to frequency stable crystal oscillators; however, the technique used for power consumption control, a very important element in the design of a crystal oscillator for use in wireless communication devices such as cellular subscriber terminals, and the frequency compensation techniques are significantly different and less advantageous than those incorporated in the oscillator of the present invention.

BRIEF SUMMARY OF THE INVENTION

In one aspect the present invention includes a crystal controlled oscillator circuit including an oscillator amplifier having an input and an output. The input is connected to a crystal resonator for establishing oscillation in a preselected frequency range. An amplitude detector is capacitively coupled to the output of the oscillator amplifier for rectifying the output signal of the oscillator output and low pass filtering that rectified signal to produce a d.c. signal proportional to the output amplitude level. A feedback loop connects the d.c. signal from the amplitude detector back to the current source of the oscillator amplifier to regulate the amplitude level of the oscillator output to a preselected value and limit power consumption of the oscillator circuit.

In another aspect the present invention includes a crystal controlled oscillator circuit including an oscillator amplifier having an input and an output. The input is connected to a crystal resonator for establishing oscillation in a preselected frequency range. A resonator tank capacitor circuit is also connected to the input of the oscillator amplifier and is of a select capacitance value to tune the oscillation frequency of the amplifier to a preselected value. The tank capacitor circuit includes at least one voltage variable capacitor and an initial voltage value is established across the voltage variable capacitor to tune the resonator tank capacitor circuit, and therefore the oscillator amplifier, to a preselected frequency of oscillation. The initial voltage value is established by generating a digital number, converting the digital number to an analog value proportional thereto and then converting the analog current value into a voltage value proportional thereto.

BRIEF DESCRIPTION OF THE DRAWINGS

For an understanding of the present invention and for further objects and advantages thereof, reference can now be had to the following description, taken in conjunction with the accompanying drawings in which.

DETAILED DESCRIPTION OF THE PREFERRED EMBODIMENT

The crystal oscillator of the present invention includes a crystal oscillator amplifier with control circuits wherein all components except for the quartz crystal are integrated into a single integrated circuit substrate. The CMOS design of the crystal control oscillator of the present invention includes a voltage control crystal oscillator (VCXO) with an automatic gain control (AGC) and both on-chip tuning and on-chip temperature compensation (PTAT). Two principal advantageous features of the oscillator circuit of the present invention include its automatic gain control circuit configuration, which significantly decreases the power consumption of the oscillator, and the circuit configuration of the on-chip frequency compensation for both production and temperature variations.

In the design of high performance digital wireless telecommunications circuits, there is great need for extremely accurate and highly stable frequency reference sources. In addition, it is highly desirable to be able to integrate as many components as possible onto a single substrate and to make the circuitry as small and inexpensive as possible given the other constraints. Since many modern wireless telecommunication devices such as cellular radio subscriber stations, are battery operated, the power consumption of all circuitry within a device, including the reference crystal oscillator, is also very significant.

Figure 1:
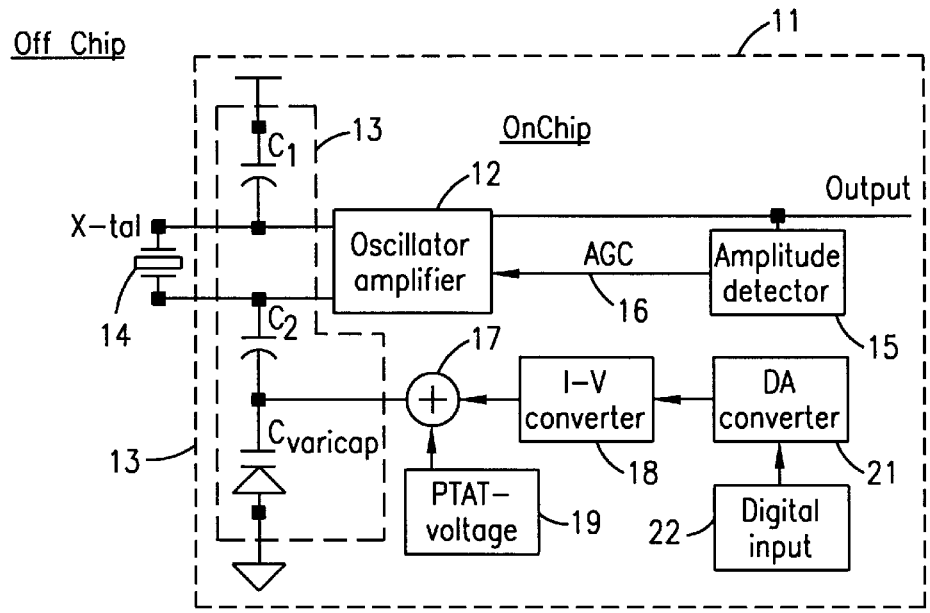
FIG. 1 is a schematic block diagram showing the components of the crystal oscillator of the present invention.

Referring first to FIG. 1, there is shown a block diagram of the crystal control oscillator design of the present invention. The design incorporates, preferably on a single chip 11, an oscillator amplifier 12 which is connected to an array of load capacitors 13 and an external quartz crystal 14 for establishing the central frequency of oscillation. The output of oscillator amplifier 12, which may comprise a standard Pierce oscillator, is connected to an amplitude detector 15 the output of which is connected in an automatic gain control (AGC) loop 16 back to the oscillator amplifier 12.

The load capacitors 13 comprise first and second tank circuit capacitors $C_1$ and $C_2$. Fixed capacitor $C_2$ is connected in series with a voltage variable capacitor $C_{varicap}$. The voltage variable capacitor $C_{varicap}$ is connected to the output of a summing circuit 17 one input of which is connected to a current to voltage (I–V) converter 18. The other input to the summing circuit 17 is connected to a proportional to absolute temperature compensation circuit (PTAT) 19. The input of the current to voltage converter 18 is driven by a digital-to-analog (D/A) converter 21 which receives a digital input signal from a number generator 22. The output voltages of the I–V converter 18 and the PTAT circuit 19 are summed in the circuit 17 and connected to drive the voltage variable capacitor $C_{varicap}$ and, thereby, establish its capacitance value. Variations in the capacitance value of $C_{varicap}$ change the total load capacitance 13 across the oscillator amplifier 12, and thus, its frequency of oscillation.

The crystal controlled oscillator of FIG. 1 comprises a highly accurate frequency reference which is extremely stable in both frequency and amplitude under virtually all operating conditions. The frequency at which the crystal oscillates is determined partially by the load capacitance 13 connected to the oscillator amplifier 12. By changing the total load capacitance 13 connected to the oscillator amplifier 12, for example, by changing the capacitance value of the variable capacitor $C_{varicap}$, the oscillation frequency of the oscillator amplifier 12 can be tuned to a specific frequency. The capacitance value of the component $C_{varicap}$ is determined by the voltage value across it and the voltage applied to the $C_{varicap}$ is produced by the summation of two different voltages in the summer circuit 17. These voltages include, first, the voltage from the circuit (PTAT) 19 which is proportional to absolute temperature and the voltage from the trans-resistance amplifier (the I–V converter 18) which converts the current from the digital to analog converter 21 into a voltage value. During the manufacturing process of the crystal control oscillator, a digital value is written into the DAC 21 by means of a digital input 22 which calibrates the oscillator to a specified frequency at its initial manufacture. In this way, compensation for production variations can be very readily performed during the manufacturing process itself. During operation the PTAT circuit 19 delivers a voltage which is proportional to the ambient temperature of the chip 11 upon which the oscillator is constructed and thereby compensates for temperature changes during operating conditions.

The automatic gain control (AGC) circuit, comprising the amplitude detector 15 and the AGC loop 16, perform two important functions. The first function is to provide a high loop gain in the oscillator amplifier 12 during its initial startup in order to secure oscillation under all operating conditions. The second function is to maintain the oscillation of the oscillator amplifier 12 at a defined amplitude value during sustained operation in order to conserve power within the circuit. The value of the amplitude of the output of the oscillator amplifier 12 is detected by the amplitude detector 15 and a signal proportional to this amplitude is fed back in the AGC loop 16 to control the amplifier gain. Within the oscillator amplifier 12, the voltage of the feedback signal regulates the current in the amplifier and thus the forward gain and the loop gain of the amplifier.

Load Capacitance Circuit

The oscillator amplifier resonator tank circuit 13 consists of capacitances $C_1$, $C_2$ and $C_{varicap}$. These capacitances are designed to give a total load capacitances of in the range of approximately 20 pF, in accordance with a particular exemplary design of a crystal resonator 14. The frequency at which the crystal will oscillate is partially determined by its load capacitance. $C_1$ and $C_2$ may be fixed capacitances formed directly on the substrate 11 while $C_{varicap}$ is a voltage control capacitance also formed directly on the substrate 11. The capacitance contribution due to parasitic capacitances both on and off the substrate 11 must be included in the total load capacitance.

The variable capacitor $C_{varicap}$ is used to compensate for variation in the following parameters: (1) production tolerances in values of the fixed capacitances $C_1$ and $C_2$ formed on the substrate 11; (2) parasitic capacitances both on and off the substrate 11; (3) temperature fluctuation of the oscillator circuit; and (4) tolerance of the crystal resonator 14. An exemplary representative value of the $C_{varicap}$ compensation range is ±35 ppm. This gives a total load capacitance change on the order of 3.2 pF (assuming a total capacitance of 20 pF) since an exemplary trimming sensitivity of the crystal oscillator might be on the order of 10.8 ppm/pF.

Figure 2:
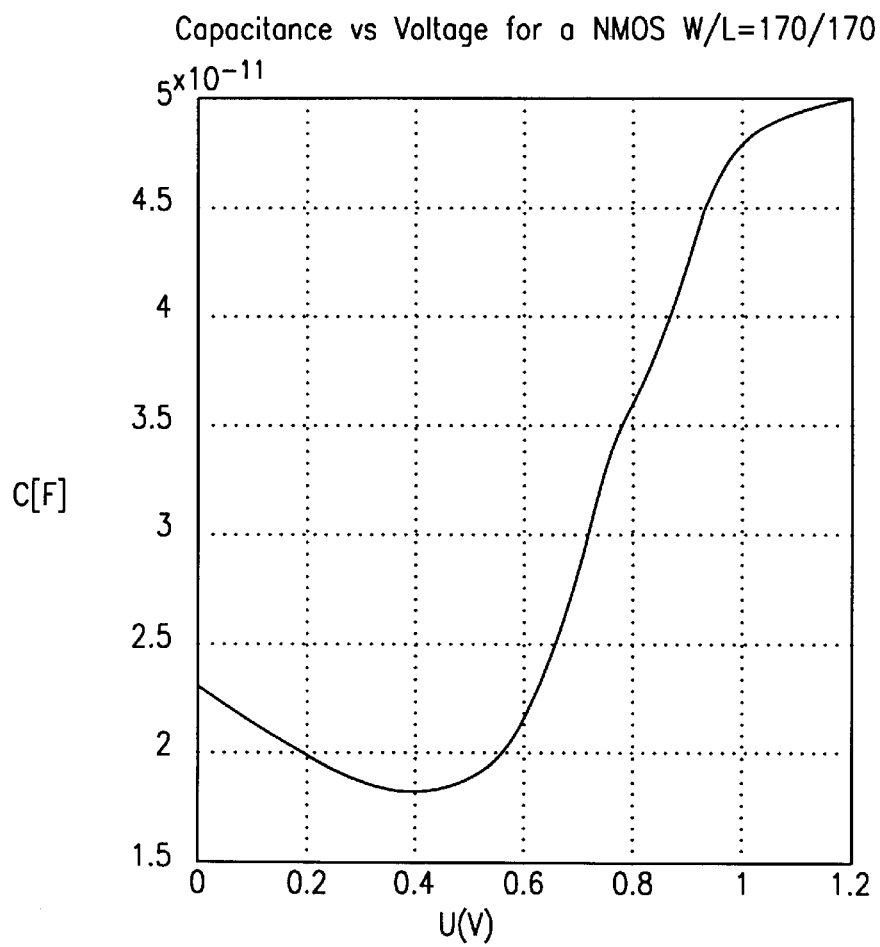
FIG. 2 is a graph showing the general relationship between capacitance and voltage dependancy for a NMOS transistor.

The $C_{varicap}$ is preferably implemented as a NMOS transistor, where the source and drain are connected as one terminal and the other terminal is employed as the gate. The NMOS transistor is used in the inversion region where the capacitance is decreasing with the gate voltage as the inversion layer grows. FIG. 2 depicts a graph of capacitance-voltage dependency for an NMOS transistor illustrating the useful region of the capacitor. Close to the oxide layer of the NMOS device, a thin depletion region appears due to the different work functions of the gate metal and the semiconductor. This depletion region increases with the applied voltage and accounts for the decreasing value of the capacitance in the left hand portion of the graph. In the middle of the depletion region (i.e., the bottom of the curve of the graph) the semiconductor behaves intrinsically close to the oxide layer and at this point the capacitance reaches its lowest value. When the voltage is further increased the semiconductor approaches the inverse mode, a conducting layer appears and excludes more and more the effect of the arrived depletion region with the result being an increasing capacitance.

The fixed capacitances $C_1$ and $C_2$ are constructed in essentially the same way as the $C_{varicap}$ but the substrate under the gate oxide is heavily doped so that an inversion layer and a voltage independent capacitor is achieved.

Exemplary design parameters in an oscillator of the type forming the subject of the present invention and to give a total load capacitance $C_{total}$ on the order of 20 pF±3.2 pF and produce the desired tuning range include: $C_1$=123 pF; $C_2$=70 pF; and $C_{varicap}$=14.5–39 pF. These are representative values and are optimized with respect to influences of the parasitic capacitances.

Figure 3:
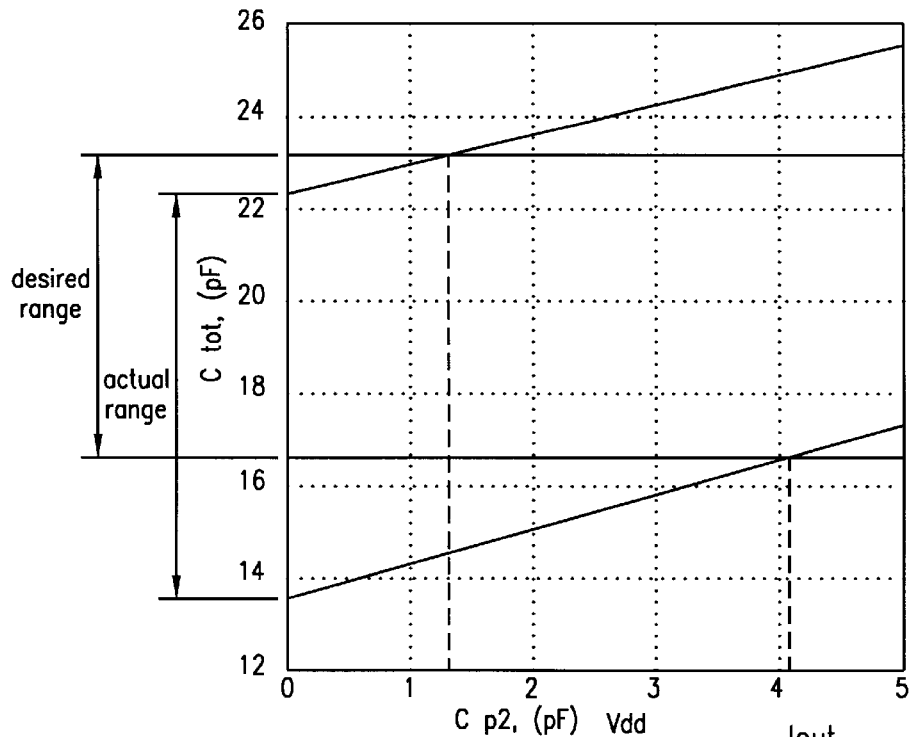
FIG. 3 is a graph showing total capacitance range as a function of parasitic capacitance.

FIG. 3 is a graph depicting the desired and actual $C_{total}$ as a function of parasitic capacitances $C_{par}$. The function will be obtained when $C_{par}$ is in the exemplary range of 1.5–4 pF. The parasitic capacitances on the chip are estimated to be approximately 1 pF. The parasitic off-chip capacitances may be in the range or 0.5–3.0 pF, which means that the design is relatively insensitive with respect to parasitic capacitances on the printed circuit board upon which the chip is mounted.

Digital-to-Analog Converter Circuit

During the manufacture of the crystal controlled oscillator of the present invention, its frequency is calibrated to a specific value. This is performed by the writing of a digital word into digital-to-analog converter (DAC) 21. The current from the DAC 21 is then converted into an output voltage which is applied to the $C_{varicap}$. The capacitance of the $C_{varicap}$, and thus the total load capacitance 13 of the oscillator amplifier 12, is changed and the frequency of oscillation adjusted to the precise value which is desired.

Figure 4:
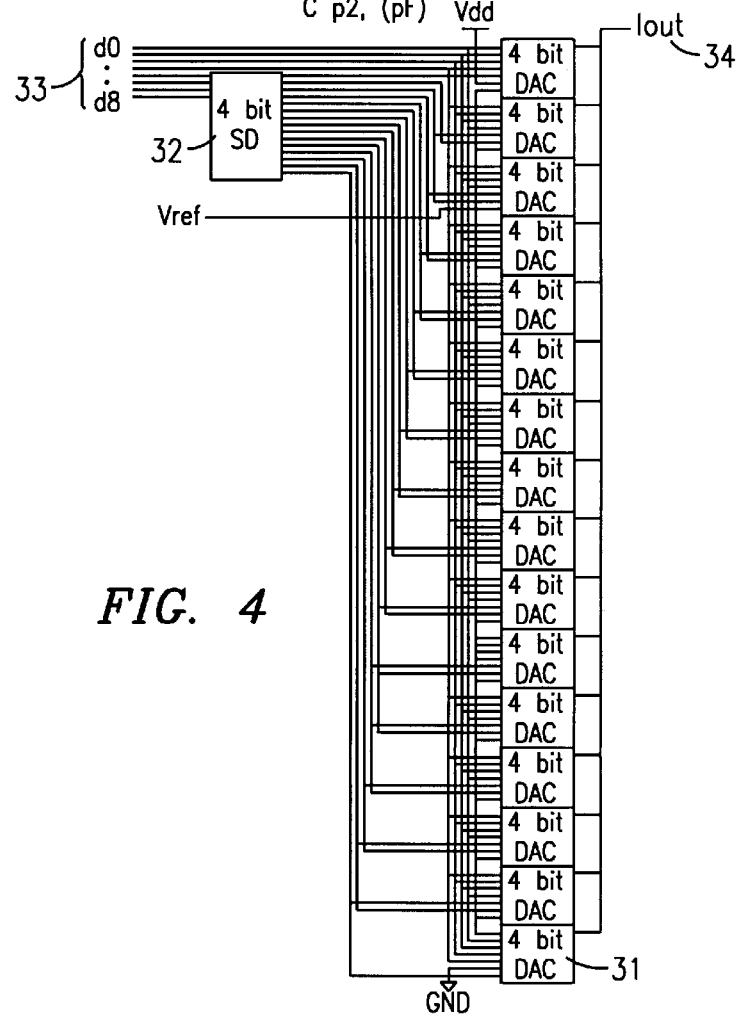
FIG. 4 is a block diagram of a D to A converter with 4-bit segment decoding and 4-bit current weighting as incorporated in the circuit of the present invention.

The design of a digital-to-analog converter for this application involves numerous considerations, including speed limitations, monotonicity, chip area occupied and power consumption. Monotonicity is important for this application since the DAC is part of a loop during calibration and a local maximum or minimum in the output function can make calibration impossible. Power consumption is also important because the oscillator is battery powered. The current based DAC 21 is constructed with 4-bit current weighted switches organized in blocks and a 4-bit segment decoder 32. The entry of a digital word at the input 33 produces a corresponding current at output 34. As illustrated in FIG. 4, each of the blocks 31 is connected to the four least significant bits (LSB). The four most significant bits (MSB) are segment decoded and turns the blocks active with higher input values. A new current is added to the previous current with higher digital input values. In this way, monotonicity is guaranteed with the circuitry set forth in FIG. 4.

Proportion to Absolute Temperature Circuit

Proportional to absolute temperature (PTAT) circuit 19 is used to compensate for variations in the oscillator circuitry due to temperature variations of the substrate 11. The PTAT circuit 19 produces a voltage which is proportional to the chip temperature. This voltage is added to the voltage obtained from the output current of the DAC 21 in summer 17 and their sum is applied to the terminal. Thus, variation in the value of $C_{varicap}$ changes the total capacitance of local capacitors 13 to alter the frequency of oscillation. The total load capacitance is thus changed by the PTAT circuit 19 to compensate the frequency of the oscillator amplifier 12 for variations in temperature. The PTAT output voltage is based on the temperature dependency of an MOS transistor and is constructed by taking a stable reference voltage and connecting it to a voltage divider which includes a heavily doped resistor with a negative temperature coefficient.

Current-to-Voltage Converter

The current-to-voltage (I–V) converter 18 converts the current from the DAC 21 to a voltage and adds to it the voltage from the PTAT 19. The I–V converter 18 is constructed as a trans-resistance amplifier and consists of a two stage operational amplifier with a resistance connected between the output and the negative input. The current from the DAC 21 is applied to the negative input and the voltage from the PTAT 19 is applied at the other input of the operational amplifier. The output results is the summation of these two input voltages, represented as a summer 17, which is applied to the $C_{varicap}$.

Oscillator Amplifier

The oscillator amplifier 12 is constructed as a differential amplifier with a single output which provides high gain which is easily adjustable. The amplifier is designed with a voltage input, which controls the current source in the amplifier. The size of this current determines the loop gain of the oscillator. A voltage is applied to this input by the automatic gain control (AGC) 16 and the loop gain is regulated to an appropriate value controlled by the AGC 16.

During startup, when there is no oscillation, the AGC 16 provides a feedback signal to the amplifier that allows maximum current in the amplifier. This results in a very high loop gain, ensuring that the oscillation amplitude grows from noise in the amplifier itself. As the oscillation amplitude grows, the AGC 16 reduces the current in the oscillator amplifier and thus the loop gain. At steady state oscillation the AGC 16 establishes an oscillation at a defined, low amplitude value. The current is limited just above its critical value in normal operation and power consumption is thereby kept at a minimum value. Amplitude regulation also eliminates non-linear effects in the amplifier, which otherwise could degrade the frequency stability of the oscillator.

AGC Loop

The output signal from the oscillator amplifier 12 is capacitance coupled to eliminate any D-C components and then rectified and low pass filtered to obtain a signal proportional to the amplitude of the oscillation in an amplitude detector 15. The signal from the amplitude detector 15 is fed back to the current source of the amplifier and thus regulates the oscillation amplitude of the circuit to a preselected value to precisely control the power consumption of the amplifier to a preselected minimum value.

As can be seen from the above description, the crystal oscillator of the present invention provides two very desirable features for a highly stable crystal control oscillator for use in electronic circuitry requiring a high degree of precision and compactness. More particularly, the oscillator of the present invention provides an AGC circuit which ensures both the reliable initiation of oscillation at startup and careful control of power consumption by the oscillator during operation. In addition, the oscillator of the present invention provides a highly reliable and accurate means for frequency compensation of the oscillator both for production variations as well as for temperature variations during operation of the oscillator.

Although preferred embodiments of the method and apparatus of the present invention have been illustrated in the accompanying drawings and described in the foregoing description, it is understood that the invention is not limited to the embodiment(s) disclosed but it capable of numerous rearrangements, modifications and substitutions without departing from the spirit of the invention as set forth and defined in the following claims.

What is claimed is:

1. A crystal controlled oscillator circuit comprising:
   an oscillator amplifier having an input and an output, said input being connected to a crystal resonator for establishing oscillation in a preselected frequency range;
   means for rectifying the output signal from said oscillator amplifier;
   means for capacitively coupling the output of said oscillator amplifier to said rectifying means;

means for low pass filtering the output signal from said rectifying means to produce a d.c. signal proportional to the amplitude of the output of said oscillator amplifier;

a feedback loop for connecting said d.c. signal from said low pass filtering means back to a current source of said oscillator amplifier to regulate the amplitude level of the oscillator amplifier output to a preselected value and limit power consumption of said oscillator circuit; and means for tuning said oscillator amplifier in response to variations in absolute temperature of said oscillator circuit.

2. A crystal controlled oscillator circuit as set forth in claim 1 wherein said oscillator amplifier comprises a differential amplifier having a voltage input for controlling the current source within the amplifier to establish the loop gain of said amplifier.

3. A crystal controlled oscillator circuit comprising:

an oscillator amplifier having an input and an output, said input being connected to a crystal resonator for establishing oscillation in a preselected frequency range;

means for rectifying the output signal from said oscillator amplifier;

means for capacitively coupling the output of said oscillator amplifier to said rectifying means;

means for low pass filtering the output signal from said rectifying means to produce a d.c. signal proportional to the amplitude of the output of said oscillator amplifier;

a feedback loop for:
 connecting said d.c. signal from said amplitude detector back to a current source of said oscillator amplifier to regulate the amplitude level of the oscillator amplifier output to a preselected value and limit power consumption of said oscillator circuit; and
 providing a signal to the current source of said oscillator amplifier at startup which allows maximum current within said amplifier to produce a very high loop gain and induce oscillation within the amplifier.

4. A crystal controlled oscillator circuit comprising:

an oscillator amplifier having an input and an output, said input being connected to a crystal resonator for establishing oscillation in a preselected frequency range;

an amplitude detector connected to the output of said oscillator amplifier for detecting the amplitude level of the oscillator amplifier output and producing a d.c. signal proportional to the output amplitude level of said oscillator;

a feedback loop for connecting said d.c. signal from said amplitude detector back to a current source of said oscillator amplifier to regulate the amplitude level of the oscillator amplifier output to a preselected value and limit power consumption of said oscillator circuit;

a resonator tank capacitor circuit connected to the input of said oscillator amplifier and having a select capacitance value to tune the oscillation frequency of said amplifier to a preselected value, said tank capacitor circuit including at least one voltage variable capacitor;

means for establishing an initial voltage value across said voltage variable capacitor to tune said resonator tank capacitor circuit, and therefore said oscillator amplifier, to a preselected frequency of oscillation; and means for adding to said initial voltage value a temperature compensation voltage value to also adjust the capacitance value of said voltage variable capacitor in response to temperature variations in the circuitry and retain said oscillation frequency at said preselected value, said temperature compensation voltage adding means comprises a circuit which produces a voltage value which is proportional to the absolute temperature of the circuit.

5. A crystal controlled oscillator circuit comprising:

an oscillator amplifier having an input and an output, said input being connected to a crystal resonator for establishing oscillation in a preselected frequency range;

an amplitude detector connected to the output of said oscillator amplifier for detecting the amplitude level of the oscillator amplifier output and producing a d.c. signal proportional to the output amplitude level of said oscillator;

a feedback loop for connecting said d.c. signal from said amplitude detector back to a current source of said oscillator amplifier to regulate the amplitude level of the oscillator output to a preselected value and limit power consumption of said oscillator circuit;

a resonator tank capacitor circuit connected to the input of said oscillator amplifier and having a select capacitance value to tune the oscillation frequency of said amplifier to a preselected value, said tank capacitor circuit including at least one voltage variable capacitor;

means for establishing an initial voltage value across said voltage variable capacitor to tune said resonator tank capacitor circuit, and therefore said oscillator amplifier, to a preselected frequency of oscillation;

means for adding to said initial voltage value a temperature compensation voltage value to also adjust the capacitance value of said voltage variable capacitor in response to temperature variations in the oscillator circuit and retain said oscillation frequency at said preselected value; and said temperature compensation voltage adding means comprises a circuit which produces a voltage value which is proportional to the absolute temperature of the oscillator circuit, said circuit for providing a voltage value which is proportional to the absolute temperature of the oscillator circuit comprises a stable reference voltage connected to a voltage divider which includes as one element a heavily doped resistor with a negative temperature coefficient.

6. A crystal controlled oscillator circuit comprising:

an oscillator amplifier having an input and an output, said input being connected to a crystal resonator for establishing oscillation in a preselected frequency range;

an amplitude detector connected to the output of said oscillator amplifier for detecting the amplitude level of the oscillator output and producing a d.c. signal proportional to the output amplitude level of said oscillator;

a feedback loop for connecting said d.c. signal from said amplitude detector back to a current source of said oscillator amplifier to regulate the amplitude level of the oscillator amplifier output to a preselected value and limit power consumption of said oscillator circuit;

a resonator tank capacitor circuit connected to the input of said oscillator amplifier and having a select capacitance value to tune the oscillation frequency of said amplifier to a preselected value, said tank capacitor circuit including at least one voltage variable capacitor;

means for establishing an initial voltage value across said voltage variable capacitor to tune said resonator tank capacitor circuit, and therefore said oscillator amplifier, to a preselected frequency of oscillation; and said amplitude detector comprises,
  means for rectifying the output signal from said oscillator amplifier;
  means for capacitively coupling the output of said oscillator amplifier to said rectifying means; and
  means for low pass filtering the output signal from said rectifying means to produce a signal proportional to the amplitude of the oscillation of said oscillator amplifier; and said initial voltage value establishing means comprises,
  means for generating a digital number;
  means for converting said digital number into an analog current value proportional to the value of said digital number;
  means for converting said analog current value into a voltage value proportional to said current value; and
  means for coupling said voltage value to said voltage variable capacitor to establish the capacitance value thereof.

7. A method for generating an oscillator output signal while controlling the power consumption of the oscillator, said method comprising:
  providing an oscillator amplifier having an input and an output, said input being connected to a crystal resonator for establishing oscillation in a preselected frequency range;
  tuning said oscillator amplifier in response to variations in absolute temperature of the oscillator circuit;
  rectifying the output signal from said oscillator amplifier;
  capacitively coupling the output of said oscillator amplifier to said rectifying means;
  low pass filtering the output signal from said rectifying means to produce a d.c. signal proportional to the amplitude of the output of said oscillator amplifier; and
  connecting said d.c. signal in a feedback loop from said amplitude detector back to a current source of said oscillator amplifier to regulate the amplitude level of the oscillator amplifier output to a preselected value and limit power consumption of said oscillator circuit.

8. A method for generating an oscillator output signal while controlling the power consumption of the oscillator, said method comprising:
  providing an oscillator amplifier having an input and an output, said input being connected to a crystal resonator for establishing oscillation in a preselected frequency range;
  rectifying the output signal from said oscillator amplifier;
  capacitively coupling the output of said oscillator amplifier to said rectifying means;
  low pass filtering the output signal from said rectifying means to produce a d.c. signal proportional to the amplitude of the output of said oscillator amplifier;
  connecting said d.c. signal in a feedback loop from said amplitude detector back to a current source of said oscillator amplifier to regulate the amplitude level of the oscillator amplifier output to a preselected value and limit power consumption of said oscillator circuit by providing a signal to said current source of said oscillator amplifier at startup to allow maximum current within said amplifier to produce a very high loop gain and induce oscillation within said amplifier.

9. A method of generating an oscillator output signal while controlling the power consumption of the oscillator, said method comprising:
  providing an oscillator amplifier having an input and an output, said input being connected to a crystal resonator for establishing oscillation in a preselected frequency range;
  connecting an amplitude detector to the output of said oscillator amplifier to detect the amplitude level of the oscillator output and produce a d.c. signal proportional to the output amplitude level of said oscillator;
  connecting said d.c. signal from said amplitude detector in a feedback loop back to a current source of said oscillator amplifier to regulate the amplitude level of the oscillator amplifier output to a preselected value and limit power consumption of said oscillator circuit;
  connecting a resonator tank capacitor circuit having a select capacitance value to the input of said oscillator amplifier to tune the oscillation frequency of said amplifier to a preselected value, said tank capacitor circuit including at least one voltage variable capacitor;
  establishing an initial voltage value across said voltage variable capacitor to tune said resonator tank capacitor circuit, and therefore said oscillator amplifier, to a preselected frequency of oscillation; and
  adding to said initial voltage value a temperature compensation voltage value to also adjust the capacitance value of said voltage variable capacitor in response to temperature variations in the oscillator circuit and retain said oscillation frequency at said preselected value, said step of adding to said initial voltage value further includes:
  generating a voltage value which is proportional to the absolute temperature of the oscillator circuit.

10. A method of generating an oscillator output signal while controlling the power consumption of the oscillator, said method comprising:
  providing an oscillator amplifier having an input and an output, said input being connected to a crystal resonator for establishing oscillation in a preselected frequency range;
  connecting an amplitude detector to the output of said oscillator amplifier to detect the amplitude level of the oscillator output and produce a d.c. signal proportional to the output amplitude level of said oscillator;
  connecting said d.c. signal from said amplitude detector in a feedback loop back to a current source of said oscillator amplifier to regulate the amplitude level of the oscillator amplifier output to a preselected value and limit power consumption of said oscillator circuit;
  connecting a resonator tank capacitor circuit having a select capacitance value to the input of said oscillator amplifier to tune the oscillation frequency of said amplifier to a preselected value, said tank capacitor circuit including at least one voltage variable capacitor;
  establishing an initial voltage value across said voltage variable capacitor to tune said resonator tank capacitor circuit, and therefore said oscillator amplifier, to a preselected frequency of oscillation; and
  adding to said initial voltage value a temperature compensation voltage value to also adjust the capacitance value of said voltage variable capacitor in response to temperature variations in the oscillator circuit and retain said oscillation frequency at said preselected value, said step of adding to said initial voltage value further includes:
  generating a voltage value which is proportional to the absolute temperature of the oscillator circuit, said step of generating further includes:

providing a stable reference voltage connected to a voltage divider which includes as one element a heavily doped resistor with a negative temperature coefficient.

11. A method of generating an oscillator output signal while controlling the power consumption of the oscillator, said method comprising:

providing an oscillator amplifier having an input and an output, said input being connected to a crystal resonator for establishing oscillation in a preselected frequency range;

connecting an amplitude detector to the output of said oscillator amplifier to detect the amplitude level of the oscillator amplifier output and produce a d.c. signal proportional to the output amplitude level of said oscillator;

connecting said d.c. signal from said amplitude detector in a feedback loop back to a current source of said oscillator amplifier to regulate the amplitude level of the oscillator amplifier output to a preselected value and limit power consumption of said oscillator circuit;

connecting a resonator tank capacitor circuit having a select capacitance value to the input of said oscillator amplifier to tune the oscillation frequency of said amplifier to a preselected value, said tank capacitor circuit including at least one voltage variable capacitor;

establishing an initial voltage value across said voltage variable capacitor to tune said resonator tank capacitor circuit, and therefore said oscillator amplifier, to a preselected frequency of oscillation;

said step of connecting an amplitude detector further includes:

rectifying the output signal from said oscillator amplifier;

capacitively coupling the output of said oscillator amplifier to said rectifying means; and low pass filtering the output signal from said rectifying means to produce a signal proportional to the amplitude of the oscillation of said oscillator amplifier; and said step of establishing an initial voltage value further comprises:

generating a digital number;

converting said digital number into an analog current value proportional to the value of said digital number;

converting said analog current value into a voltage value proportional to said current value; and coupling said voltage value to said voltage variable capacitor to establish the capacitance value thereof.

12. A crystal controlled oscillator circuit comprising:

an oscillator amplifier having an input and an output, said input being connected to a crystal resonator for establishing oscillation in a preselected frequency range;

an amplitude detector connected to the output of said oscillator amplifier for detecting the amplitude level of the oscillator output and producing a d.c. signal proportional to the output amplitude level of said oscillator amplifier;

a feedback loop for connecting said d.c. signal from said amplitude detector back to a current source of said oscillator amplifier to regulate the amplitude level of the oscillator amplifier output to a preselected value and limit power consumption of said oscillator circuit;

a resonator tank capacitor circuit connected to the input of said oscillator amplifier and having a select capacitance value to tune the oscillation frequency of said oscillator amplifier to a preselected value, said resonator tank capacitor circuit including at least one voltage variable capacitor; and means for establishing an initial voltage value to be applied across said voltage variable capacitor to tune said resonator tank capacitor circuit, and therefore said oscillator amplifier, to a preselected frequency of oscillation which comprises:

means for tuning said oscillator amplifier in response to production variations while manufacturing said oscillator circuit; and means for tuning said oscillator amplifier in response to temperature variations while operating said oscillator circuit.

13. The crystal controlled oscillator circuit of claim 12, wherein:

said means for tuning said oscillator amplifier in response to production variations while manufacturing said oscillator circuit further includes:

means for generating a digital number;

means for converting said digital number into an analog current value proportional to a said digital number; and means for converting said analog current value into a production compensation voltage value which is proportional to said analog current value;

said means for tuning said oscillator amplifier in response to temperature variations while operating said oscillator circuit further includes:

means for generating a temperature compensation voltage value which is proportional to the absolute temperature of said oscillator circuit;

means for summing the temperature compensation voltage value and the production compensation voltage value to establish the initial voltage value; and means for connecting the initial voltage value to said resonator tank capacitor circuit.

14. A crystal controlled oscillator circuit constructed on a single substrate comprising:

an oscillator amplifier having an input and an output, said input being connected to a crystal resonator for establishing oscillation in a preselected frequency range;

an amplitude detector connected to the output of said oscillator amplifier for detecting the amplitude level of the oscillator output and producing a d.c. signal proportional to the output amplitude level of said oscillator amplifier;

a feedback loop for connecting said d.c. signal from said amplitude detector back to a current source of said oscillator amplifier to regulate the amplitude level of the oscillator amplifier output to a preselected value and limit power consumption of said oscillator circuit;

a resonator tank capacitor circuit connected to the input of said oscillator amplifier and having a select capacitance value to tune the oscillation frequency of said oscillator amplifier to a preselected value, said resonator tank capacitor circuit including at least one voltage variable capacitor; and means for establishing an initial voltage value to be applied across said voltage variable capacitor to tune said resonator tank capacitor circuit, and therefore said oscillator amplifier, to a preselected frequency of oscillation which comprises:

means for tuning said oscillator amplifier in response to production variations while manufacturing said oscillator circuit; and means for tuning said oscillator amplifier in response to temperature variations while operating said oscillator circuit.

15. The crystal controlled oscillator circuit of claim 14, wherein:
said means for tuning said oscillator amplifier in response to production variations while manufacturing said oscillator circuit further includes:
means for generating a digital number;
means for converting said digital number into an analog current value proportional to a said digital number; and
means for converting said analog current value into a production compensation voltage value which is proportional to said analog current value;
said means for tuning said oscillator amplifier in response to temperature variations while operating said oscillator circuit further includes:
means for generating a temperature compensation voltage value which is proportional to the absolute temperature of said oscillator circuit;
means for summing the temperature compensation voltage value and the production compensation voltage value to establish the initial voltage value; and
means for connecting the initial voltage value to said resonator tank capacitor circuit.

16. A method for generating an oscillator signal, comprising:
providing an oscillator amplifier having an input and an output, said input being connected to a crystal resonator for establishing oscillation in a preselected frequency range;
connecting an amplitude detector to the output of said oscillator amplifier to detect the amplitude level of the oscillator output and produce a d.c. signal proportional to the output amplitude level of said oscillator amplifier;
connecting said d.c. signal from said amplitude detector in a feedback loop back to a current source of said oscillator amplifier to regulate the amplitude level of the oscillator amplifier output to a preselected value and limit power consumption of said oscillator circuit;
connecting a resonator tank capacitor circuit to the input of said oscillator amplifier and having a select capacitance value to tune the oscillation frequency of said oscillator amplifier to a preselected value, said tank capacitor circuit including at least one voltage variable capacitor; and
establishing an initial voltage value to be applied across said voltage variable capacitor to tune said resonator tank capacitor circuit, and therefore said oscillator amplifier, to a preselected frequency of oscillation in accordance with the following steps:
tuning said oscillator amplifier in response to production variations while manufacturing said oscillator circuit; and
tuning said oscillator amplifier in response to temperature variations while operating said oscillator circuit.

17. The method of claim 16, wherein:
said step of tuning said oscillator amplifier in response to production variations while manufacturing said oscillator circuit further includes:
generating a digital number;
converting said digital number into analog current value proportional to a said digital number; and
converting said analog current value into a production compensation voltage value which is proportional to said analog current value;
said step of tuning said oscillator amplifier in response to temperature variations while operating said oscillator circuit further includes:
generating a temperature compensation voltage value which is proportional to the absolute temperature of said oscillator circuit; and
summing the temperature compensation voltage value and the production compensation voltage value to establish the initial voltage value; and
connecting the initial voltage value to said resonator tank capacitor circuit.

18. The crystal controlled oscillator circuit as set forth in claim 4, wherein said feedback loop provides a signal to the current source of said oscillator amplifier at startup which allows maximum current within said amplifier to produce a very high loop gain and induce oscillation within the amplifier.

19. The method of generating an oscillator output signal as set forth in claim 9, further comprising the step of providing a signal to the current source of said oscillator amplifier at startup which allows maximum current within said amplifier to produce a very high loop gain and induce oscillation within the amplifier.

20. The crystal controlled oscillator circuit as set forth in claim 12, wherein said feedback loop provides a signal to the current source of said oscillator amplifier at startup which allows maximum current within said amplifier to produce a very high loop gain and induce oscillation within the amplifier.

21. The crystal controlled oscillator circuit as set forth in claim 14 wherein said feedback loop provides a signal to the current source of said oscillator amplifier at startup which allows maximum current within said amplifier to produce a very high loop gain and induce oscillation within the amplifier.

22. The method of claim 16, further comprising the step of providing a signal to the current source of said oscillator amplifier at startup which allows maximum current within said amplifier to produce a very high loop gain and induce oscillation within the amplifier.

* * * * *